United States Patent
Yang et al.

(12) 
(10) Patent No.: US 7,214,466 B1
(45) Date of Patent: May 8, 2007

(54) CATIONICALLY POLYMERIZABLE PHOTOIMAGEABLE THICK FILM COMPOSITIONS, ELECTRODES, AND METHODS OF FORMING THEREOF

(75) Inventors: Haixin Yang, Chapel Hill, NC (US); Mark R. McKeever, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/302,618

(22) Filed: Dec. 14, 2005

(51) Int. Cl.
*G03F 7/029* (2006.01)
*G03F 7/033* (2006.01)
*G03F 7/032* (2006.01)
*G03F 7/40* (2006.01)

(52) U.S. Cl. .................. 430/198; 430/280.1; 430/910; 430/914

(58) Field of Classification Search ................ 430/198, 430/280.1, 910, 914
See application file for complete search history.

(56) References Cited

U.S. PATENT DOCUMENTS

| | | | |
|---|---|---|---|
| 3,583,931 A | 6/1971 | Bouchard | |
| 4,912,019 A | 3/1990 | Nebe et al. | |
| 4,925,771 A | 5/1990 | Nebe et al. | |
| 5,049,480 A | 9/1991 | Nebe et al. | |
| 5,486,545 A | 1/1996 | Crivello | |
| 5,567,858 A | 10/1996 | Crivello | |
| 5,851,732 A | 12/1998 | Kanda et al. | |
| 5,886,115 A | 3/1999 | Crivello | |
| 6,075,155 A | 6/2000 | Crivello | |
| 6,075,319 A | 6/2000 | Kanda et al. | |
| 6,235,808 B1 | 5/2001 | Crivello | |
| 6,268,403 B1 | 7/2001 | Crivello | |
| 7,135,267 B2 * | 11/2006 | Yang et al. | 430/198 |
| 2003/0215747 A1 * | 11/2003 | Kim et al. | 430/284.1 |

FOREIGN PATENT DOCUMENTS

WO     WO 03/098347 A1     11/2003

\* cited by examiner

*Primary Examiner*—Richard L. Schilling

(57) ABSTRACT

The invention is directed to a photoimageable composition comprising:
(I) finely divided particles of inorganic material comprising:
(a) functional phase particles selected from electrically conductive, resistive, and dielectric particles;
(b) inorganic binder having a glass transition temperature in the range of from 325 to 600° C., a surface area of no greater than 10 $m^2/g$ and at least 85 wt. % of the particles having a size of 0.1–10 μm;
dispersed in:
(II) an organic medium comprising:
(a) aqueous developable polymer which is a copolymer, interpolymer or mixture thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety;
(g) cationically polymerizable monomer;
(h) photoinitiation system; and
(i) organic solvent.

14 Claims, 4 Drawing Sheets

CATIONICALLY POLYMERIZABLE PHOTOIMAGEABLE THICK FILM COMPOSITIONS, ELECTRODES, AND METHODS OF FORMING THEREOF

FIELD OF THE INVENTION

The invention is directed to photoimageable thick film composition(s) and tape compositions for use in photo-patterning methods. More particularly in one embodiment, photoimageable thick film paste compositions of the present invention are used to form electronic circuitry in flat panel display applications, such as plasma display panels (PDPs).

TECHNICAL BACKGROUND OF THE INVENTION

The electronics industry is continuously striving to create electronic devices that are smaller, cheaper, and provide higher resolution performance. As such, it has become necessary to develop new photoimageable compositions and processes for photopatterning which accomplish these goals.

Photo-patterning technologies offer uniform finer lines and space resolution when compared to traditional screen-printing methods. A photo-patterning method, such as DuPont's FODEL® photoimageable thick film pastes, utilizes a photo-imagable organic medium as found in U.S. Pat. No. 4,912,019; U.S. Pat. No. 4,925,771, U.S. Pat. No. 5,049,480, U.S. Pat. No. 5,851,732 and U.S. Pat. No. 6,075,319 whereby the substrate is first completely covered (printed, sprayed, coated or laminated) with the photo-imagable thick film composition and dried, if necessary. An image of the pattern is generated by exposure of the photo-imagable thick film composition with actinic radiation through a photomask bearing a pattern. The exposed substrate is then developed. The unexposed portion of the pattern is washed away leaving the photo-imaged thick film composition on the substrate that is then fired to remove organic materials and sinter inorganic materials. Such a photo-patterning method demonstrates thick film line resolution of about 30 microns or larger depending on the substrate smoothness, inorganic particle size distribution, exposure and development variables. It has been proven that such a technique is useful in the manufacture of flat panel displays, such as plasma display panels.

However, the above-mentioned photo-imagable thick film compositions and tape compositions are all based on free-radical polymerization, where acrylate or methacrylate monomers are polymerized by initiation of free radicals that are in turn generated by decomposition of photoinitiators. The polymerized acrylate or methacrylate monomers make UV-exposed area less soluble.

Free radical polymerization can be inhibited by oxygen in air or in thick film compositions. Currently, almost all PDP makers use a so-called off-contact way to expose photo-imagable thick film composition to avoid possible damage of photomasks. Quite often, thick film compositions are tacky to some extent. If a photo-mask contacts the composition, part of the composition could get onto the photo-mask and damage the images on the mask. The 'off-contact' means that there is gap between photo-mask with desired electronic circuitry pattern and thick film composition to be exposed. The gap is filled with air, i.e. with the presence of oxygen. This is one of the causes for processing variability.

The present invention relates to a composition(s) with cationically polymerizable monomers (including epoxy monomers), method of photo-patterning, and method of forming an electrode. For the compositions presented by this invention, UV-exposure is no longer sensitive to the presence of oxygen between the gap of the off-contact exposure. This invention discloses novel thick film paste and tape compositions, methods of photo-patterning, and electrode formation. The thick film paste compositions contain epoxide monomers and onium salt photoinitiators. Onium salts decompose upon actinic UV-radiation to generate super acids or cations, which in turn initiate the polymerization of epoxide monomers. The polymerized epoxide monomers make UV-exposed areas less soluble and remain as electronic circuitry pattern on a substrate after development.

SUMMARY OF THE INVENTION

The invention is directed to a photoimageable composition comprising:
 (I) finely divided particles of inorganic material comprising:
  (a) Functional phase particles selected from electrically conductive, resistive, and dielectric particles;
  (b) inorganic binder having a glass transition temperature in the range of from 325 to 600° C., a surface area of no greater than 10 m$^2$/g and at least 85 wt. % of the particles having a size of 0.1–10 μm;
 dispersed in:
 (II) an organic medium comprising;
  (c) aqueous developable polymer which is a copolymer, interpolymer or mixture thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety;
  (d) cationically polymerizable monomer;
  (e) photoinitiation system; and
  (f) organic solvent.

The present invention is further directed to tape(s) and tape composition(s) formed from the photoimageable composition described above, methods of photo-patterning utilizing such compositions, and articles/devices formed from said composition(s) and method(s).

DETAILED DESCRIPTION

Figure 1:
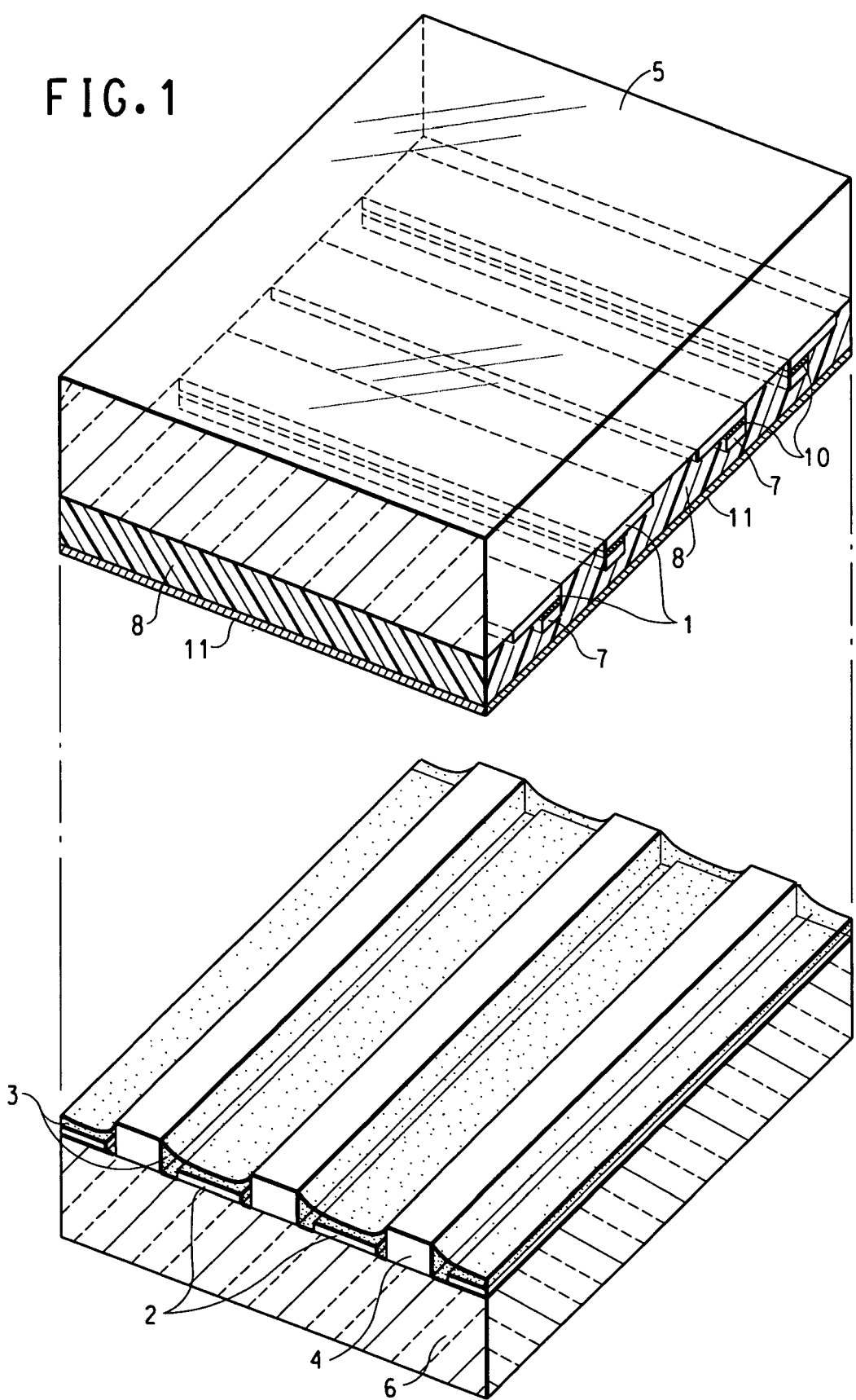
FIG. 1 illustrates a black electrode in an AC PDP.
Figure 2A:
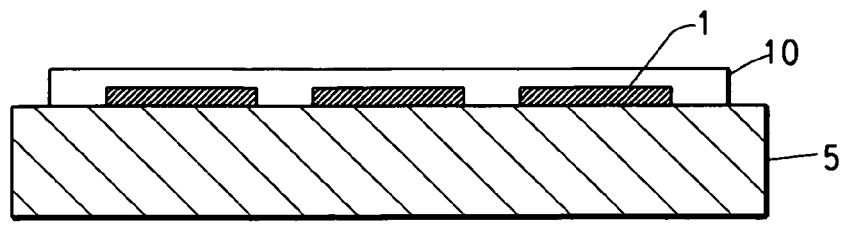
FIG. 2, a–e shows the processes involved in forming an embodiment of the invention.
Figure 2B:
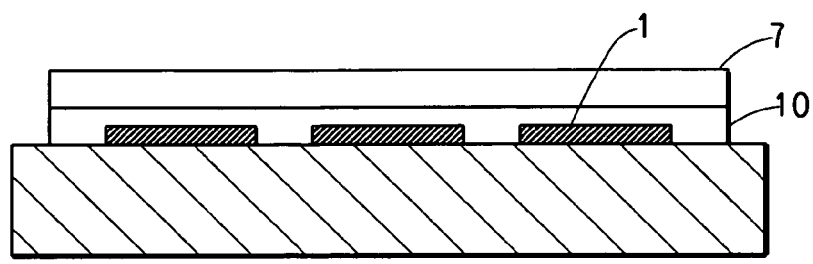
Figure 2C:
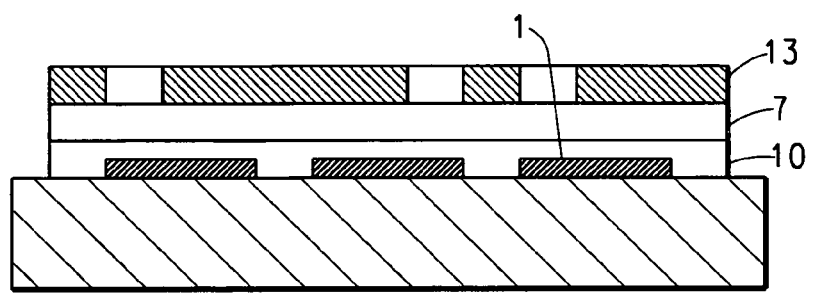
Figure 2D:
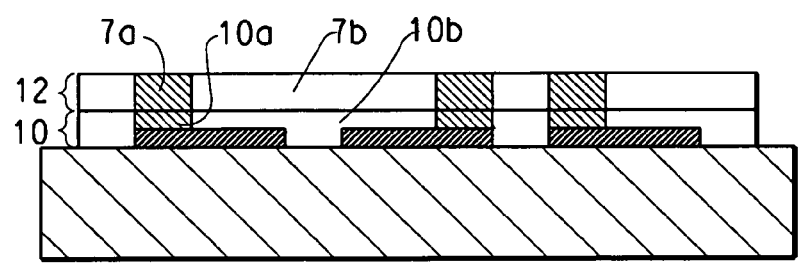
Figure 2E:
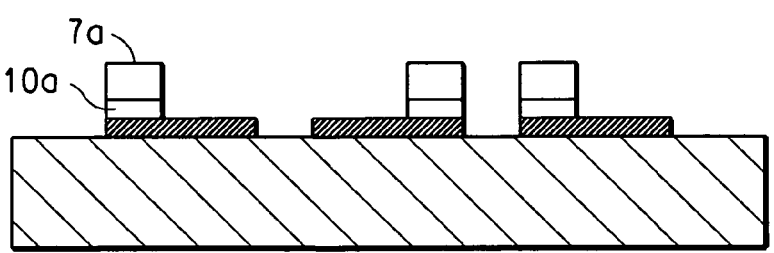
Figure 3A:
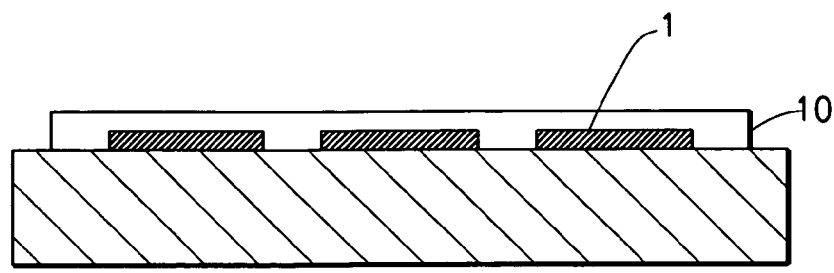
FIG. 3, a–h shows the processes involved in forming a second embodiment of the invention.
Figure 3B:
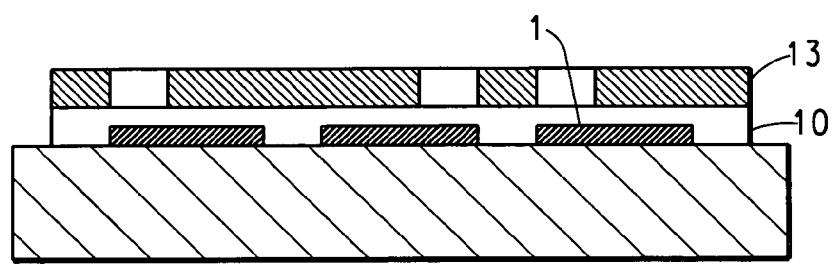
Figure 3C:
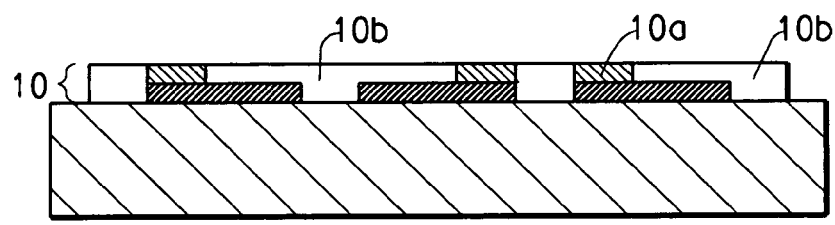
Figure 3D:
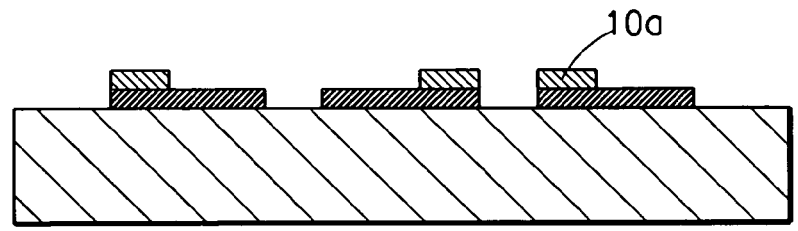
Figure 3E:
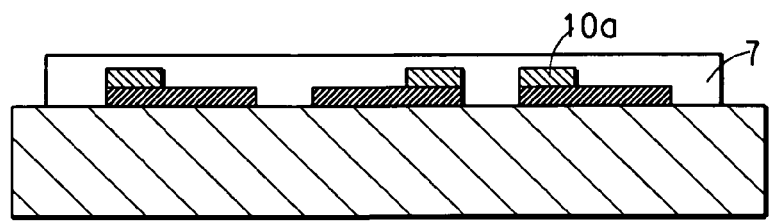
Figure 3F:
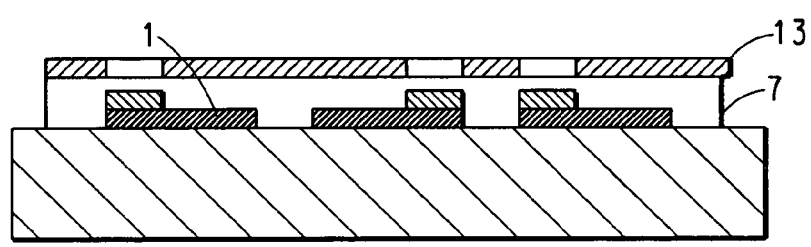
Figure 3G:
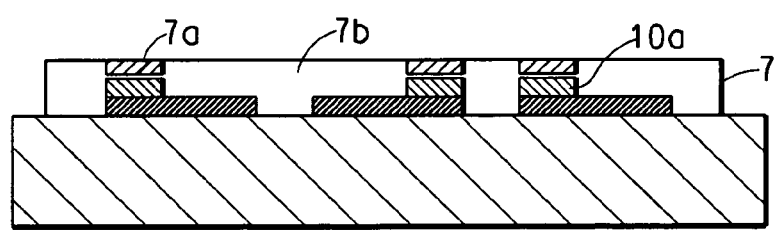
Figure 3H:
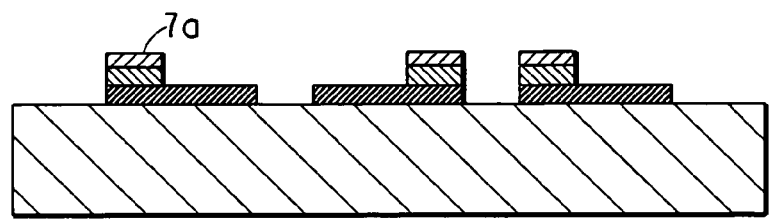

Generally, a thick film composition comprises a functional phase that imparts appropriate electrically functional properties, such as conductive, resistive, and dielectric properties. The functional phase comprises electrically functional powders dispersed in an organic medium that acts as a carrier for the functional phase. The functional phase determines the electrical properties and influences mechanical properties of a fired thick film. The thick film paste compositions and tape compositions of the present invention comprise such a functional phase along with an inorganic binder dispersed in an organic medium.

The invented compositions can be use under the general processing of photoimageable thick film pastes, such as Fodel® products by DuPont, to form PDP electrodes includes printing or covering thick film paste over glass substrate, drying the printed paste at an elevated temperature to remove solvent for, UV-exposure, development and firing. However, a post-exposure drying step may allow better image or pattern quality.

As demonstrated in Example I (one embodiment),

A tape or sheet may be formed from the present invention by drying the composition at a time and temperature sufficient to remove the organic solvent. A tape of such kind can be applied to a substrate by, but not limited to, laminating. Then laminated tapes can be further processed as printed pastes.

The main components of the photoimageable composition(s) of the present invention will be discussed herein below.

I. Inorganic Materials

A. Functional Phase—Electrically Functional Powders (Particles)

i. Conductor Applications

In conductor applications, the functional phase is comprised of electrically functional conductor powder(s). The electrically functional powders in a given thick film composition may comprise a single type of powder, mixtures of powders, alloys or compounds of several elements. Electrically functional conductive powders that may be used in this invention include, but are not limited to gold, silver, nickel, aluminum, palladium, molybdenum, tungsten, tantalum, tin, indium, lanthanum, gadolinium, boron, ruthenium, cobalt, tantalum, yttrium, europium, gallium, sulfur, zinc, silicon, magnesium, barium, cerium, strontium, lead, antimony, conductive carbon, platinum, copper, or mixtures thereof.

The metal particles may be coated or not coated with organic materials. In particular, the metal particles may be coated with a surfactant. In one embodiment, the surfactant is selected from stearic acid, palmitic acid, a salt of stearate, a salt of palmitate and mixtures thereof. The counter-ion can be, but is not limited to, hydrogen, ammonium, sodium, potassium and mixtures thereof.

In one embodiment, if a mixture of stearic and palmitic or salts thereof are used, it is preferred to be within the range of ratios of 30/70 to 70/30 and all ranges of ratios contained therein. In one embodiment, the surfactant is found in the composition within the range of 0.10–1 wt. % based on the weight of the silver particles whether found on the silver particles or added to the composition.

A metal powder(s) of virtually any shape, including spherical particles and flakes (rods, cones, and plates) may be used in practicing the invention. In an embodiment, metal powders are gold, silver, palladium, platinum, copper and combinations thereof.

In a further embodiment, the particles may be spherical.

In a further embodiment, the present invention relates to dispersions. The dispersions may include compositions, particles, flakes, or a combination thereof. It has been found that the dispersion of the invention must contain no significant amount of solids having a particle size of less than 0.1 μm. When the dispersions are used to make thick film pastes, which are usually applied by screen-printing, the maximum particle size must not exceed the thickness of the screen. In a particular embodiment, at least 80 percent by weight of the conductive solids fall within the 0.5–10 μm range.

In an additional embodiment, the surface area of the conductive particles does not exceed 20 $m^2/g$; in an aspect of this embodiment, the surface area of the conductive particles does not exceed 10 $m^2/g$; and in a further aspect of this embodiment, the surface area of the conductive particles does not exceed 5 $m^2/g$. When metal particles having a surface area greater than 20 $m^2/g$ are used, the sintering characteristics of the accompanying inorganic binder are adversely affected.

ii. Resistor Applications

In resistor compositions, the functional phase is generally a conductive oxide. Examples of the functional phase in resistor compositions include Pd/Ag, $RuO_2$, pyrochlore oxides, as well as others known in the art.

Ruthenium based polynary oxides are one type of pyrochlore oxide that is a multicomponent compound of $Ru^{+4}$, $Ir^{+4}$, or their mixture (M") represented by the following general formula $$(M_xBi_{2-x})(M'_yM''_{2-y})O_{7-z}$$

M is chosen from a group consisting of yttrium, thallium, indium, cadmium, lead, copper, and rare earth materials, M' is chosen from a group consisting of platinum, titanium, chromium, rhodium, and antimony, M" is ruthenium, iridium or their mixture, x is 0–2 but $x \leq 1$ for univalent copper, y is 0–0.5 but when M' is rhodium or is more than 1 of platinum, titanium, chromium, rhodium, or antimony, y is 0–1, and z is 0–1 but when M is bivalent lead or cadmium, this is at least equal to about x/2.

The ruthenium pyrochlore oxides are found in detail in U.S. Pat. No. 3,583,931 which is incorporated herein by reference.

Preferable ruthenium polynary oxides are bismuth ruthenate $Bi_2Ru_2O_7$, lead ruthenate $Pb_2Ru_2O_6$, $Pb_{1.5}Bi_{0.5}Ru_2O_{6.5}$, $PbBiRu_2O_{6.75}$ and $GdBiRu_2O_6$. These materials can easily be obtained in pure form. They are not adversely affected by glass binders and are stable even when heated to about 1000° C. in air.

The ruthenium oxides and/or ruthenium pyrochlore oxides are used in proportions of 4–50 wt %, preferred 6–30%, more preferred 5–15% and most preferred 9–12%, based on the weight of the entire composition including the organic medium.

Conductive metal oxide particles may also be useful in the present invention. These conductive metal oxide particles are especially useful in conductive black compositions for display applications. The conductive metal oxide particles contain finely divided particles of inorganic material comprising an oxide of two or more elements selected from Ba, Ru, Ca, Cu, Sr, Bi, Pb, and the rare earth metals. In particular, these oxides are metal oxides with metallic or semi-metallic conductivity. Rare earth metals include Scandium (Sc) and Yttrium (Y) (atomic numbers 21 and 39) and the lanthanide elements, which include La, Ce, Pr, Nd, Pm, Sm, Eu, Gd, Tb, Dy, Ho, Er, Tm, Yb, and Lu (atomic numbers 57 through 71). Preferred oxides are oxides of two or more elements selected from Ba, Ru, Ca, Cu, La, Sr, Y, Nd, Bi, and Pb. Additionally, a Ni powder may be utilized as the black conductor.

The surface area to weight ratio of the metal oxide(s) of the present invention may be in the range of 2 to 20 $m^2/g$. In one embodiment, the range is 5 to 15 $m^2/g$. In a further embodiment, the range of surface area to weight ratio is 6 to 10 $m^2/g$.

iii. Dielectric Applications

In dielectric compositions, the functional phase may be a glass or ceramic. Dielectric thick film compositions are non-conducting compositions or insulator compositions that separate electrical charges and may result in the storage of an electrical charge. Therefore, the thick film dielectric compositions may contain ceramic powders, oxide and non-oxide frits, crystallization initiator or inhibitor, surfactants, colorants, organic mediums, and other components common in the art of such thick film dielectric compositions. Examples of ceramic solids include, but are not limited to: alumina, titanates, zirconates and stannates, $BaTiO_3$, $CaTiO_3$, $SrTiO_3$, $PbTiO_3$, $CaZrO_3$, $BaZrO_3$, $CaSnO_3$, $BaSnO_3$, and $Al_2O_3$, glass and glass-ceramic. It is also applicable to precursors of such materials, i.e., solid materials which upon firing are converted to dielectric solids, and to mixtures thereof.

B. Inorganic Binder

The function of an inorganic binder and generally a glass frit used in this invention is to bind the particles to one another and to the substrate after firing. Examples of inorganic binders include glass binders (frits), metal oxides and ceramics. Glass binders useful in the composition are conventional in the art. Some examples include borosilicate and aluminosilicate glasses. Non-limiting examples further include combinations of oxides, such as: $B_2O_3$, $SiO_2$, $Al_2O_3$, CdO, CaO, BaO, ZnO, $SiO_2$, $Na_2O$, $Li_2O$, PbO, and ZrO which may be used independently or in combination to form glass binders. Metal oxides useful in thick film compositions are conventional in the art and can be, for example, ZnO, MgO, CoO, NiO, FeO, MnO and mixtures thereof.

The glass frits most preferably used are the borosilicate frits, such as lead borosilicate frit, bismuth, cadmium, barium, calcium, or other alkaline earth borosilicate frits. In one embodiment, the glass binder is a Pb-free glass frit. While various Pb-free frits may be utilized, barium-bismuth based Pb-free glass frits are especially useful. In one embodiment, the inorganic binder is a lead-free glass frit comprising, based on weight percent total glass binder composition: 55–85% $Bi_2O_3$, 0–20% $SiO_2$, 0–5% $Al_2O_3$, 2–20% $B_2O_3$, 0–20% ZnO, 0–15% of one or more of oxides selected from BaO, CaO, and SrO; and 0–3% of one or more of oxides selected from $Na_2O$, $K_2O$, $Cs_2O$, $Li_2O$ and mixtures thereof, and wherein said glass binder composition is lead-free or substantially lead-free.

The preparation of such glass frits is well known and may include, for example, the steps of melting together the constituents of the glass in the form of the oxides of the constituents, and pouring such molten composition(s) into water to form the frit. The batch ingredients may, as recognized by one of skill in the art, be any compounds that will yield the desired oxides under the usual conditions of frit production. For example, boric oxide will be obtained from boric acid, silicon dioxide will be produced from flint, barium oxide will be produced from barium carbonate, etc. The glass is preferably milled in a ball mill with water to reduce the particle size of the frit and to obtain a frit of substantially uniform size. It is then settled in water to separate fines and the supernatant fluid containing the fines is removed. Other methods of classification may be used as well.

The glasses are prepared by conventional glassmaking techniques, by mixing the desired components in the desired proportions and heating the mixture to form a melt. As is well known in the art, heating is conducted to a peak temperature and for a time such that the melt becomes entirely liquid and homogeneous. The desired glass transition temperature is in the range of 325 to 600° C.

In a particular embodiment, at least 85% the inorganic binder particles may be 0.1–10 μm. In an aspect of this embodiment, the weight ratio of inorganic binder to total solids may be in the range 0.1 to 0.75 μm; and in a further aspect, in the range of 0.2 to 0.5 μm.

C. Organic Polymer

The polymer binder(s) in the compositions described herein have aqueous developability and give a high resolving power.

The polymer binder itself is not photosensitive. They are made of copolymer, interpolymer or mixtures thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety which is at least 10% by weight.

The presence of acidic comonomer components in the composition is important in this technique. The acidic functional group provides the ability to be developed in aqueous bases such as aqueous solutions of 0.4–2.0% sodium carbonate. When acidic comonomers are present in concentrations of less than 10%, the composition is not washed off completely with an aqueous base. When the acidic comonomers are present at concentrations greater than 30%, the composition is less resistant under development conditions and partial development occurs in the image portions. Appropriate acidic comonomers include ethylenically unsaturated monocarboxylic acids such as acrylic acid, methacrylic acid, or crotonic acid and ethylenically unsaturated dicarboxylic acids such as fumaric acid, itaconic acid, citraconic acid, vinyl succinic acid, and maleic acid, as well as their hemiesters, and in some cases their anhydrides and their mixtures. In a particular embodiment, methacrylic polymers are used (instead of acrylic polymers) due to their clean burning properties in low-oxygen atmospheres.

When the nonacidic comonomers are alkyl acrylates or alkyl methacrylates as mentioned above, the nonacidic comonomers may constitute at least 50 wt. % of the polymer binder; in a particular embodiment, the nonacidic comonomers constitute 70–85 wt %. When the nonacidic comonomers are styrene or substituted sytrenes, it is preferable that these nonacidic comonomers constitute 50 wt. % of the polymer binder and that the other 50 wt. % is an acid anhydride such as the hemiester of maleic anhydride. A favorable substituted styrene is alpha-methylstyrene.

In an embodiment, the nonacidic portion of the polymer binder can contain up to about 50 wt. % of other nonacidic comonomers as substitutes for the alkyl acrylate, alkyl methacrylate, styrene, or substituted styrene portions of the polymer. Examples include, but are not limited to, acrylonitrile, vinyl acetate, and acrylamide. In an embodiment, less than about 25 wt. % of such monomers in the total polymer binder is used. In an embodiment, single copolymers or combinations of copolymers as binders may be used. In addition to the above copolymers, small amounts of other polymer binders may be added. Examples of these include, but are not limited to, polyolefins such as polyethylene, polypropylene, polybutylene, polyisobutylene, and ethylene-propylene copolymers, polyvinyl alcohol polymers (PVA), polyvinyl pyrrolidone polymers (PVP), vinyl alcohol and vinyl pyrrolidone copolymers, as well as polyethers that are low alkylene oxide polymers such as polyethylene oxide.

Furthermore, the weight average molecular weight of the polymer binder may be in the range of 2,000–250,000, including any ranges contained therein. The molecular weight of the polymer binder will depend on the application.

The total polymer in the composition may be in the range of 5–70 wt. % based on total composition and any ranges contained therein.

D. Cationically Polymerizable Monomer

Conventional cationically polymerizable monomers and oligomers, such as epoxy compounds, enolic ethers and allenic ethers may be used in the invention. Monomer components may be present in amounts of 20 weight % or less, in respect to the total weight of the dry photopolymerizable layer. In further embodiments, the amount of monomer is present in the ranges of 1–20 weight percent, 1–5 weight percent, 3–5 weight percent, all in respect to the total weight of the dry photopolymerizable layer. In one embodiment, the amount of cationically polymerizable monomers is in the range of 3–10 weight %, in respect to the total weight of the dry photopolymerizable layer.

E. Photoinitiation System

Suitable photoinitiation systems are those, which generate superacid cations upon exposure to actinic light at ambient temperature. These include, but not limited to the substituted or unsubstituted onium salts, such iodonium salts and sulfonium salts. The photoinitiator or photoinitiator system is present in 0.05 to 10% by weight based on the total weight of a dry photopolymerizable layer.

F. Organic Solvent(s)

The organic solvent component of the organic medium, which may be a solvent or mixture of solvents, is chosen so as to obtain solution therein of the polymer and other organic components. The solvent should be non-protonic and inert (non-reactive) towards the other constituents of the composition. In a particular embodiment, the solvent(s) may have sufficiently high volatility to enable the solvent to be evaporated from the dispersion by the application of relatively low levels of heat at atmospheric pressure. In a further aspect of this embodiment, the solvent may not be so volatile that the paste rapidly dries on a screen, at normal room temperatures, during the printing process. These solvents may be useful for screen printable and photoimageable pastes, for example. In a further aspect, the solvents for use in the paste compositions may have boiling points at atmospheric pressure of less than 300° C.; in another aspect, the solvents have boiling points at atmospheric pressure of less than 250° C. Such solvents include, but are not limited to, xylene, ethylene glycol monobutyl ether and butyl cellosolve acetate and mixtures of thereafter.

In a particular embodiment, the solvent(s) have lower boiling points than solvents used for screen printable pastes. These solvents may used in casting tapes, for example. Such solvents include, but are not limited to, ethylacetate, acetone, methylethyl ketone and toluene.

G. Other Additives

Frequently the organic medium will also contain one or more stabilizers to neutralize prematurely formed superacids, and plasticizers to assure good lamination to substrates and enhance the developability of unexposed areas of the composition. The choice of stabilizers is determined by the photoinitiators and formulations. Trialkylamines are normal choice. The choice of plasticizers is determined primarily by the polymer that must be modified. Among the plasticizers which have been used in various binder systems are diethyl phthalate, dibutyl phthalate, butyl benzyl phthalate, dibenzyl phthalate, alkyl phosphates and polyester plasticizers. Additional components known in the art may be present in the composition including dispersants, release agents, dispersing agents, stripping agents, anti-foaming agents and wetting agents. A general disclosure of suitable materials is presented in U.S. Pat. No. 5,049,480, which is hereby incorporated by reference herein.

Flat Panel Display Applications

While the present invention is described below as useful in one embodiment of a flat panel display application (black electrode), it is understood by those skilled in the art that it is useful in a multitude of electronic applications. For example, in addition to various flat panel display applications, the present invention has utility in automotive applications, as well.

The present invention includes black electrodes formed from the above black conductive compositions. The black electrodes of the present invention can be favorably used in flat panel display applications, particularly in alternating-current plasma display panel devices. The black electrodes can be formed between the device substrate and conductor electrode array.

In one embodiment, the electrode of the present invention is used in AC PDP (Alternating-Current Plasma Display Panel) applications, as described below. It is understood that the compositions and electrodes of the present invention may be used in other flat panel display applications and their description in AC PDP devices is not intended to be limiting. An example of the black electrodes of the present invention used in an alternating-current plasma display panel is explained below. This description includes two-layer electrodes comprising a black electrode between the substrate and conductor electrode (bus electrode). It is further understood that a single layer electrode may be formed when the black composition comprises the additional optional precious metal or metals, typically silver. Also, the method for making an alternating-current plasma display panel device is described herein. The alternating-current plasma display panel device includes front and back dielectric substrates with a gap and an electrode array containing parallel first and second electrode composite groups in a discharge space filled with ionizing gas. The first and second electrode composite groups face each other perpendicularly with the discharge space in the middle. A certain electrode pattern is formed on the surface of the dielectric substrate, and a dielectric material is coated on the electrode array on at least one side of the dielectric substrate. In this device, at least the electrode composite on the front dielectric substrate is fitted with the conductor electrode array group connected to the bus conductor on the same substrate, and with the black electrode of the present invention formed between the above substrate and the above conductor electrode array.

FIG. 1 illustrates the black electrode of the present invention in an AC PDP. FIG. 1 shows the AC PDP using the black electrode of the present invention. As shown in FIG. 1, the AC PDP device has the following components: underlying transparent electrode (1) formed on glass substrate (5); black electrode (10) formed on the transparent electrode (1) (the black conductive composition of the present invention is used for the black electrode (10)); bus electrode (7) formed on the black electrode (10) (bus electrode (7) is a photosensitive conductor composition containing conductive metal particles from metals selected from Au, Ag, Pd, Pt and Cu or combinations thereof (described in detail below)). The black electrode (10) and bus conductor electrode (7) are exposed imagewise by actinic radiation to form a pattern, developed in a basic aqueous solution, and fired at an elevated temperature to remove the organic components and to sinter the inorganic material. The black electrode (10) and bus conductor electrode (7) are patterned using an identical or very similar image. The final result is a fired, highly conductive electrode composite, which appears to be black on the surface of the transparent electrode (1), and when placed on the front glass substrate, reflection of external light is suppressed.

The word 'black' used in this specification means a black color with significant visual contrast against a white background. The term is not limited to black which possesses the absence of color. The degree of "blackness" may be measured with a colorimeter to determine an L-value. The L-value represents lightness where 100 is pure white and 0 is pure black. Although shown in FIG. 1, the transparent electrode described below is not necessary in forming the plasma display device of the present invention.

When a transparent electrode is used, $SnO_2$ or ITO may be used for forming the transparent electrode (1), by chemical vapor deposition or electro-deposition such as ion sputtering or ion plating. The components of the transparent electrode and method for its formation in the present invention are those of the conventional AC PDP production technology, well known to those in the art.

As shown in FIG. 1, the AC PDP device of the present invention is based on a glass substrate having dielectric coating layer (8) and MgO coating layer (11) over the patterned and fired metallization.

The conductor lines are uniform in line width and are not pitted or broken, have high conductivity, optical clarity and good transparency between lines.

Next, a method for making both a bus electrode and black electrode over the optional transparent electrode on the glass substrate of the front plate of a PDP device is illustrated.

As shown in FIG. 2, the formation method of the one embodiment of the present invention involves a series of processes ((A)–(E)).

(A) A process of applying a black electrode-forming photosensitive thick film composition layer (10) on a transparent electrode (1) formed using $SnO_2$ or ITO according to a conventional method known to those in the art, on the glass substrate (5), then drying the thick film composition layer (10) in a nitrogen or air atmosphere. The black electrode composition is a lead-free black conductive composition of the present invention. (FIG. 2(A)).

(B) Applying to the first applied black electrode composition layer (10) a photosensitive thick film conductor composition (7) for forming the bus electrodes, then drying the thick film composition layer (7) in a nitrogen or air atmosphere. The photosensitive thick film conductive composition is described below. (FIG. 2(B)).

(C) Imagewise exposing the first applied black electrode composition layer (10) and the second bus electrode composition layer (7) to actinic radiation (typically a UV source) through a phototool or target (13) having a shape corresponding to a pattern of the black and bus electrodes arranged in correlation with the transparent electrodes (1), using exposure conditions that yield the correct electrode pattern after development. (FIG. 2(C))

(D) A process of developing the exposed parts (10a, 7a) of the first black conductive composition layer (10) and the second bus electrode composition layer (7) in a basic aqueous solution, such as a 0.4 wt % sodium carbonate aqueous solution or other alkali aqueous solution. This process removes the unexposed parts (10b, 7b) of the layers (10, 7). The exposed parts (10a, 7a) remain (FIG. 2 (D)). The developed product is then dried.

(E) After process, (D), the parts are then fired at a temperature of 450–650° C., depending upon the substrate material, to sinter the inorganic binder and conductive components (FIG. 2 (E)).

The formation method of the second embodiment of the present invention is explained below with FIG. 3. For convenience, the numbers assigned for each part of FIG. 3 are same as FIG. 2. The method of the second embodiment involves a series of processes (A'–H').

A'. A process of applying a black electrode-forming photosensitive thick film composition layer (10) on a transparent electrode (1) formed using $SnO_2$ or ITO according to a conventional method known to those in the art, on the glass substrate (5), then drying the thick film composition layer (10) in a nitrogen or air atmosphere. The black electrode composition is a lead-free black conductive composition of the present invention. (FIG. 3(A)).

B'. Imagewise exposing the first applied black electrode composition layer (10) to actinic radiation (typically a UV source) through a phototool or target (13) having a shape corresponding to a pattern of the black electrodes arranged in correlation with the transparent electrodes (1), using exposure conditions that yield the correct black electrode pattern after development. (FIG. 3(B)).

C'. A process of developing the exposed part (10a) of the first black conductive composition layer (10) in a basic aqueous solution such as a 0.4 wt % sodium carbonate aqueous solution or other alkali aqueous solution for removal of the unexposed parts (10b) of the layers (10) (FIG. 3 (C)). The developed product is then dried.

D'. After process, (C'), the parts are then fired at a temperature of 450–650° C., depending upon the substrate material, to sinter the inorganic binder and conductive components (FIG. 3(D)).

E'. A process of applying the bus electrode-forming photosensitive thick film composition layer (7) to the black electrode (10a) according to the fired and patterned part (10a) of the first photosensitive thick film composition layer (10), then drying in a nitrogen or air atmosphere. (FIG. 3(E)). The photosensitive thick film conductor composition is described below.

F'. Imagewise exposing the second applied bus electrode composition layer (7) to actinic radiation (typically a UV source) through a phototool or target (13) having a shape corresponding to a pattern of the bus electrodes arranged in correlation with the transparent electrodes (1) and black electrode (10a), using exposure conditions that yield the correct electrode pattern after development. (FIG. 3(F)).

G'. A process of developing the exposed part (7a) of the second bus conductive composition layer (7) in a basic aqueous solution such as a 0.4 wt % sodium carbonate aqueous solution or other alkali aqueous solution for removal of the unexposed parts (7b) of the layers (7) (FIG. 3 (G)). The developed product is then dried.

H'. After process, (G'), the parts are then fired at a temperature of 450–650° C., depending upon the substrate material, to sinter the inorganic binder and conductive components (FIG. 3 (H)).

The third embodiment (not shown) involves a series of processes ((i)–(v)) shown below. This embodiment is useful for single layer electrode applications, for example.

(i) The process of loading a black electrode composition on a substrate. This black electrode composition is the black conductive composition of the present invention described above.

(ii) The process of loading a photosensitive conductive composition on a substrate. This photosensitive conductive composition is described below.

(iii) The process of setting an electrode pattern by imagewise exposure of the black composition and conductive composition by actinic radiation.

(iv) The process of developing the exposed black composition and conductive composition by a basic aqueous solution for removal of the area not exposed to actinic radiation.

(v) The process of firing the developed conductive composition.

The front glass substrate assembly formed as described above can be used for an AC PDP. For example, referring back to FIG. 1, after forming the transparent electrode (1) in relation to the black electrode (10) and bus electrode (7) on the front glass substrate (5), the front glass substrate assembly is covered with dielectric layer (8), then coated with MgO layer (11). Next, the front glass substrate (5) is combined with rear glass substrate (6). A number of display cells screen printed with phosphor with cell barrier (4) formation are set on the rear glass (6). The electrode formed on the front substrate assembly is perpendicular to the address electrode formed on the rear glass substrate. The discharge space formed between the front glass substrate (5) and rear glass substrate (6) is sealed with a glass seal and at the same time a mixed discharge gas is sealed into the space. The AC PDP device is thus assembled.

Next, bus conductive compositions for bus electrodes are explained below.

The bus conductive compositions used in the present invention may be photosensitive thick film conductive compositions available commercially. As noted above, the bus conductive composition comprises (a) conductive metal particles of at least one metal selected from Au, Ag, Pd, Pt, and Cu and combinations thereof; (b) at least one inorganic binder; (c) photoinitiator; and (d) photocurable monomer. In one embodiment of the present invention, the bus conductive composition comprises Ag.

The conductive phase is the main component of the above composition, typically comprising silver particles with a particle diameter within the range of 0.05–20 µm (microns) in a random or thin flake shape. The bus conductive composition is herein described with reference to one embodiment comprising silver particles, but is not intended to be limiting. When a UV-polymerizable medium is used together with the composition, the silver particles should have a particle diameter within the range of 0.3–10µ. Compositions may contain 5–75 wt % of silver particles based on the overall thick film paste.

The silver conductive composition for forming a bus electrode may also contain 0–10 wt % of a glass binder and/or 0–10 wt % of refractory materials that do not form glass or a precursor as needed, in addition to Ag. Examples of the glass binder include lead-free glass binders described above. Refractory materials that do not form glass and precursors are, e.g., alumina, copper oxide, gadolinium oxide, tantalum oxide, niobium oxide, titanium oxide, zirconium oxide, cobalt iron chromium oxide, aluminum, copper, various commercially available inorganic pigments, etc.

Objectives for adding the second, third, and more inorganic additives in addition to such main components are for control of the pattern shape, suppression or promotion of sintering during firing, adhesive property retention, control of the main-metal component diffusion, inhibition of discoloration near the bus electrode, control of resistance, control of the thermal expansion coefficient, mechanical strength retention, etc. The type and amount are selected as needed within the range of having no significant adverse effects on the basic performance.

Furthermore, the silver conductive compositions may also contain 10–30 wt % of a photosensitive medium in which the above particulate materials are dispersed. Such a photosensitive medium may be polymethyl methacrylate and a polyfunctional monomer solution. This monomer is selected from those with a low volatility for minimizing evaporation during the silver conductive composition paste preparation and printing/drying process before the UV curing. The photosensitive medium may also contain a solvent and UV initiator. The UV polymerizable medium may include a polymer based on methyl methacrylate/ethyl acrylate in a 95/5 ratio (weight based). The silver conductive composition described above has a viscosity of 10–200 Pa-s, for a free-flowing paste.

Suitable solvents for such a medium are, but not limited to, butyl Carbitol acetate, Texanol® and β-terpineol. Additional solvents that may be useful include those listed in Section (G) Organic Medium, above. Such a medium may be treated with dispersants, stabilizers, etc.

SAMPLE PREPARATION AND TEXT PROCEDURES

Organic Medium Preparation

The organic medium may serve as a vehicle for dispersion of the finely divided solids of the composition in such form that it can readily be applied to a glass or other substrate. The organic medium may first be one in which the solids are dispersible with an adequate degree of stability. Secondly, the rheological properties of the organic medium may be such that they lend good application properties to the dispersion.

A general procedure for preparation of organic medium is as follows. The solvent and acrylic polymer are mixed and heated with stirring to 100° C. Heating and stirring are continued until the entire binder polymer had dissolved. The remaining organic components are added and the mixture is stirred at 50° C., under yellow light, until all the solids dissolve. The solution is allowed to cool.

General Paste Preparation

Typically, thick film compositions are formulated to have a paste-like consistency, and are called "pastes". Generally, the pastes are prepared under yellow light by mixing the organic vehicle, monomer(s), and other organic components in a mixing vessel. The inorganic materials are then added to the mixture of organic components. The total composition is then mixed until the inorganic powders are wetted by the organic materials. The mixture is then roll milled using a three-roll mill. The paste viscosity at this point could be adjusted with the appropriate vehicle or solvent to achieve a viscosity optimum for processing.

As known by one of skill in the art, care is taken to avoid dirt contamination in the process of preparing paste compositions and in preparing parts, since such contamination can lead to defects.

General Tape Preparation

The composition(s) of the present invention may be used to form a tape, sheet, roll, or other like entity, for example. We will discuss the entity in general, example, non-limiting, terms of tape formation.

The composition of the present invention may be used in the form of a tape. If the composition is to be used in the form of a tape, a slip may be prepared and used for tape casting. Slip is a general term used for the composition in tape making and is a properly dispersed mixture of inorganic powders dispersed in an organic medium. A common way of achieving a good dispersion of inorganic powders in the organic medium is by using a conventional ball-milling process. A ball mill consists of ceramic milling jar and milling media (typically spherical or cylindrical shaped alumina or zirconia pellets). The total mixture is put into the milling jar and the milling media are added. After closing the jar with a leak-tight lid, it is tumbled to create a milling action of the milling media inside the jar at a rolling speed at which the mixing efficiency is optimized. The length of the rolling is the time required to attain well-dispersed inorganic particles to meet the performance specifications. The slip may be applied to a substrate by a blade or bar coating method or other method known to those in the art, followed by ambient or heat drying. The coating thickness after drying may range from a few microns to several tens of microns depending on the application. The tape is formed by ambient or heat drying to sufficiently remove the solvents. However, the time and temperature of the drying/heating is not generally sufficient to initiate the reaction between the polymer and bi-functional monomer.

The tape may be laminated with a coversheet before it is wound as a widestock roll. Silicone coated mylar (terephthalate PET film), polypropylene, polyethylene, mylar, and nylon are examples of common coversheet material and may be used as a coversheet. The coversheet is removed before laminated to the final substrate.

Preparation of Glass Frit

The glass frit was used as available, or if necessary was prepared by water milling in a Sweco Mill using 0.5 in. diameter by 0.5 in. long alumina cylinders. The glass frit mixture was then either freeze dried or hot air dried. Hot air drying was normally done at a temperature of 150° C. Other methods of glass frit preparation may be equally effective.

C. Printing and Laminating Conditions

The example black paste was first deposited on the glass substrate by screen-printing using a 355 mesh polyester screen. The parts were then dried at 50–70° C. in an air atmosphere oven for approximately 20 minutes. The dried coating thickness was measured at 5–8 microns.

The tape was laminated by hot pressing the tape onto a glass substrate and then peeling off the coversheet.

D. Process Conditions

The parts were exposed through a phototool using a collimated UV light source with a gap of about 100 microns between the phototool and sample surface. The energy level used was between 200 and 1000 mJ/sq. cm. In some cases, exposed parts were baked at 50° C. for 10 minutes before being developed. The exposed/baked parts were developed using a conveyorized spray processor containing 0.5% by weight sodium carbonate in water as the developer solution. The developer solution temperature was maintained at approximately 30° C., and the developer solution sprayed at 10–20 psi. The developed parts were dried by blowing off the excess water, after development, with a forced air stream.

General Firing Profile

The composition(s) of the present invention may be processed by using a firing profile. Firing profiles are well within the knowledge of those skilled in the art of thick film technology. Removal of the organic medium and sintering of the inorganic materials is dependent on the firing profile. The profile will determine if the medium is substantially removed from the finished article and if the inorganic materials are substantially sintered in the finished article. The term "substantially" as used herein means at least 95% removal of the medium and sintering the inorganic materials to a point to provide at least adequate resistivity or conductivity for the intended use or application.

In the examples, the dried parts were fired in an air atmosphere using a 30-hour profile, with a 10 min peak temperature between 520 to 580° C.

EXAMPLES

The compositions (in weight percentage of total composition) of Examples I–III are summarized in Table 1 below.

TABLE I

Example Compositions

| | Example I | Example II | Example III |
|---|---|---|---|
| Organic Medium | 65 | 65 | 65 |
| Silver Conductor Powder | 20 | | |
| Black Conductor Powder | | 20 | |
| Dielectric Material | | | 20 |
| UV-curable Epoxy Monomer | 15 | 15 | 15 |

Example I demonstrated a conductor composition. Example II demonstrated a black-colored conductor or resistor composition, and Example III demonstrated a dielectric composition.

GLOSSARY OF MATERIALS FOR EXAMPLES

Organic medium: A solution made of 60% of acrylate polymer, 35% of solvent, 4.5% of photoinitiator and 0.5% of inhibitor.

Acrylate polymer: A copolymer of 80%, by weight, methyl methacrylate and 20% methacrylic acid, weight average molecular weight Mw=~7,000, acid number=~125, purchased from Noveon.

Solvent: Methyl ethyl ketone, purchased from Aldrich Chemicals.

Photoinitiator: Uvacure® 1600, or phenyl-p-octyloxyphenyl-iodonium hexafluorantimonate, commercially available from UCB Chemicals.

Inhibitor: Triethylamine, purchased from Aldrich Chemicals.

Silver conductor powder: Silver powder manufactured by DuPont.

Black conductor powder: With formulation of $Bi_2Sr_2CaCu_2O_8$, made by DuPont.

Glass Frit: Glass frit with composition (in weight percent): 12.5% $B_2O_3$, 9.1% $SiO_2$, 1.4% $Al_2O_3$, 77.0% PbO, [Glass Product Number 24109 from Viox and Y-milled by DuPont].

UV-curable epoxy monomer: UVacure® 1500, a cycloaliphatic diepoxide monomer commercially available from UCB Chemicals.

What is claimed is:

1. A thick film photoimageable composition comprising:
   (I) finely divided particles of inorganic material comprising:
      (a) functional phase particles selected from electrically conductive, resistive, and dielectric particles;
      (b) inorganic binder having a glass transition temperature in the range of from 325 to 600° C., a surface area of no greater than 10 $m^2/g$ and at least 85 wt. % of the particles having a size of 0.1–10 μm;
   dispersed in:
   (II) an organic medium comprising;
      (c) aqueous developable polymer which is a copolymer, interpolymer or mixture thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety;
      (d) cationically polymerizable monomer,
      (e) photoinitiation system; and
      (f) organic solvent.

2. The cationically polymerizable monomer of claim 1(d) wherein the monomer comprises either an epoxide, an enolic ether, or an allenic ether.

3. The composition of claim 1 further comprising acrylic monomers.

4. The thick film composition of claim 1 further comprising additional organic additives.

5. The thick film composition of claim 1 wherein said photoinitation system is selected from sulfonium salts, iodonium salts and mixtures thereof.

6. The composition of claim 1 wherein said functional phase particles are selected from Au, Ag, Pd, Pt, Cu, Ni, Al and mixtures thereof.

7. The composition of claim 1 wherein said functional phase particles are selected from $RuO_2$, ruthenium-based polynary oxides and mixtures thereof.

8. The composition of claim 1 wherein said functional phase particles are a metal oxide with metallic or semimetallic conductivity selected from an oxide of two or more elements selected from Ba, Ru, Ca, Cu, Sr, Bi, Pb, and the rare earth metals wherein said metal oxide has a surface to weight ratio in the range of 2 to 20 $m^2/g$.

9. The composition of claim 4 wherein said functional phase particles are coated with organic material.

10. The composition of claim 1 wherein said inorganic binder is a lead-free glass binder.

11. The composition of claim 1 wherein said inorganic binder comprises, based on weight percent total glass binder composition: 55–85% $Bi_2O_3$, 0–20% $SiO_2$, 0–5% $Al_2O_3$, 2–20% $B_2O_3$, 0–20% ZnO, 0–15% of one or more of oxides selected from BaO, CaO, and SrO; and 0–3% of one or more of oxides selected from $Na_2O$, $K_2O$, $Cs_2O$, $Li_2O$ and mixtures thereof, and wherein said glass binder composition is lead-free or substantially lead-free.

12. A sheet comprising a layer of the composition of claim 1 wherein the composition has been dried to remove the organic solvent.

13. A method of using a composition comprising a thick film photoimageable composition to form an electrode comprising:
   (I) finely divided particles of inorganic material comprising:
      (a) functional phase particles selected from electrically conductive, resistive, and dielectric particles;
      (b) inorganic binder having a glass transition temperature in the range of from 325 to 600° C., a surface area of no greater than 10 $m^2/g$ and at least 85 wt. % of the particles having a size of 0.1–10 μm;
   dispersed in:
   (II) an organic medium comprising;
      (g) aqueous developable polymer which is a copolymer, interpolymer or mixture thereof, wherein each copolymer or interpolymer comprises (1) a nonacidic comonomer comprising a $C_{1-10}$ alkyl acrylate, $C_{1-10}$ alkyl methacrylate, styrenes, substituted styrenes or combinations thereof and (2) an acidic comonomer comprising ethylenically unsaturated carboxylic acid containing moiety;
      (h) cationically polymerizable monomer;
      (i) photoinitiation system; and
      (j) organic solvent,
   comprising the steps of:
      (a) printing or covering said composition over a glass substrate;
      (b) drying said composition at an elevated temperature to remove the solvent;
      (c) exposure to UV
      (d) development; and
      (e) firing.

14. The method of using of claim 13 further including a post exposure drying step.

* * * * *